United States Patent
Hsu et al.

(10) Patent No.: US 10,489,003 B1
(45) Date of Patent: Nov. 26, 2019

(54) CAPACITIVE TOUCH CONTROL DEVICE, ELECTRICITY CHARGING CONTROLLER, AND ELECTRICITY CHARGED CONTROLLER

(71) Applicant: PIXART IMAGING INC., Hsin-Chu (TW)

(72) Inventors: Che-Chia Hsu, Hsin-Chu (TW); Chi-Chieh Liao, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 19 days.

(21) Appl. No.: 16/022,903

(22) Filed: Jun. 29, 2018

(51) Int. Cl.
  *G06F 3/044* (2006.01)
  *H03K 17/96* (2006.01)
  *G06F 3/047* (2006.01)

(52) U.S. Cl.
  CPC .............. *G06F 3/044* (2013.01); *G06F 3/047* (2013.01); *H03K 17/962* (2013.01); *G06F 2203/04112* (2013.01)

(58) Field of Classification Search
  CPC ............... G06F 3/044; G06F 3/047; G06F 2203/04112; H03K 17/962
  See application file for complete search history.

(56) References Cited

U.S. PATENT DOCUMENTS

| | | | | |
|---|---|---|---|---|
| 9,184,502 B2* | 11/2015 | Yang | ..................... | H01Q 1/2266 |
| 2004/0183788 A1* | 9/2004 | Kurashima | ......... | G06F 3/03547 |
| | | | | 345/173 |
| 2005/0062725 A1* | 3/2005 | Shih | ........................ | G06F 3/046 |
| | | | | 345/173 |
| 2008/0165158 A1* | 7/2008 | Hotelling | ................ | G06F 3/044 |
| | | | | 345/174 |
| 2010/0219513 A1* | 9/2010 | Zhang | ..................... | H01L 23/48 |
| | | | | 257/659 |
| 2010/0321325 A1* | 12/2010 | Springer | ................. | G06F 3/041 |
| | | | | 345/174 |
| 2012/0162032 A1 | 6/2012 | Yang et al. | | |
| 2014/0176819 A1* | 6/2014 | Yilmaz | ................. | G06F 1/1692 |
| | | | | 349/12 |
| 2014/0362038 A1* | 12/2014 | Murakami | ............ | G06F 3/0416 |
| | | | | 345/174 |
| 2015/0138144 A1* | 5/2015 | Tanabe | .................... | G06F 3/045 |
| | | | | 345/174 |
| 2017/0131798 A1* | 5/2017 | Geaghan | ................. | G06F 3/044 |
| 2017/0153763 A1* | 6/2017 | Vavra | .................... | G06F 3/0488 |
| 2019/0243477 A1* | 8/2019 | Hou | ........................ | G06F 3/041 |

* cited by examiner

*Primary Examiner* — Dmitriy Bolotin
(74) *Attorney, Agent, or Firm* — Li & Cai Intellectual Property (USA) Office

(57) ABSTRACT

A capacitive touch control device includes a plurality of switching assemblies for being respectively connected to transmitting wires that connect a capacitive electrode layer. Each of the switching assemblies includes a switch, a touch drive circuit, and an antenna circuit, the latter two of which are installed to the switch. Each of the switches is provided for being connected to the corresponding transmitting wire, and is configured to be in a touch mode by electrically coupling to the touch drive circuit or in an antenna mode by electrically coupling to the antenna circuit. When the switches are in the touch mode, the switching assemblies enable the capacitive electrode layer to provide a capacitive touch function. When at least one of the switches is in the antenna mode, the corresponding switching assembly enables the capacitive electrode layer to provide an antenna function.

20 Claims, 16 Drawing Sheets

CAPACITIVE TOUCH CONTROL DEVICE, ELECTRICITY CHARGING CONTROLLER, AND ELECTRICITY CHARGED CONTROLLER

BACKGROUND OF THE DISCLOSURE

Field of the Disclosure

The present disclosure relates to a controller; in particular, to a capacitive touch control device, an electricity charging controller, and an electricity charged controller.

Description of Related Art

A conventional capacitive touch control panel is used for providing a touch control function through a capacitive electrode layer thereof, and the development of the conventional capacitive touch control panel has always been about how the touch control function can be improved. Accordingly, the existing structure of the conventional capacitive touch control panel is not considered for being expanded with additional functions.

SUMMARY OF THE DISCLOSURE

The present disclosure provides a capacitive touch control device, an electricity charging controller, and an electricity charged controller to solve the drawbacks associated with conventional capacitive touch control panels.

The present disclosure provides a capacitive touch control device for being electrically coupled to a capacitive electrode layer through a plurality of transmitting wires. The capacitive touch control device includes a plurality of switching assemblies for being respectively connected to the transmitting wires. Each of the switching assemblies includes a switch, a touch drive circuit, and an antenna circuit. The switch is configured to be connected to the corresponding transmitting wire. The touch drive circuit and the antenna circuit are installed to the switch. The switch is configured to be in a touch mode by electrically coupling to the touch drive circuit or in an antenna mode by electrically coupling to the antenna circuit. When the switch of each of the switching assemblies is in the touch mode, the switching assemblies enable the capacitive electrode layer to provide a capacitive touch function through the transmitting wires. When the switch of at least one of the switching assemblies is in the antenna mode, the at least one of the switching assemblies enables the capacitive electrode layer to provide an antenna function through the corresponding transmitting wire.

The present disclosure also provides a capacitive touch control device for being connected to a transmitting circuit that is electrically coupled to a capacitive electrode layer. The capacitive touch control device includes a switching module, a touch transceiver, and an antenna transceiver. The switching module is configured to be electrically coupled to the capacitive electrode layer through the transmitting circuit. The touch transceiver and the antenna transceiver are connected to the switching module. The switching module is configured for electrically coupling at least part of the capacitive electrode layer to the touch transceiver and the antenna transceiver by turns.

The present disclosure further provides an electricity charging controller, which includes a plurality of first switching assemblies and a plurality of second switching assemblies. The first switching assemblies are configured to be electrically coupled to a plurality of drive electrodes of a capacitive electrode layer. Each of the first switching assemblies includes a switch for being electrically coupled to the corresponding drive electrode, a touch drive circuit installed to the switch, and an antenna circuit installed to the switch. In each of the first switching assemblies, the switch is configured to be in a touch mode by being electrically coupled to the touch drive circuit or in an antenna mode by being electrically coupled to the antenna circuit. The second switching assemblies are configured to be electrically coupled to a plurality of receive electrodes of the capacitive electrode layer. Each of the second switching assemblies includes a switch for being electrically coupled to the corresponding receive electrode and a touch drive circuit installed to the switch. In each of the second switching assemblies, the switch is configured to be in a touch mode by being electrically coupled to the touch drive circuit or in an open mode by not being electrically coupled to the touch drive circuit. When the switch of each of the first switching assemblies is in the touch mode, the switch of each of the second switching assemblies is in the touch mode for enabling the capacitive electrode layer to provide a capacitive touch function. When the switch of the first switching assemblies is in the antenna mode, the switch of each of the second switching assemblies is in the open mode for enabling the drive electrodes of the capacitive electrode layer to provide a charging function.

The present disclosure further provides an electricity charged controller, which includes a plurality of first switching assemblies and a plurality of second switching assemblies. The first switching assemblies are configured to be electrically coupled to a plurality of drive electrodes of a capacitive electrode layer. Each of the first switching assemblies includes a switch for being electrically coupled to the corresponding drive electrode and a touch drive circuit installed to the switch. In each of the first switching assemblies, the switch is configured to be in a touch mode by electrically coupled to the touch drive circuit or in an open mode by not electrically coupling to the touch drive circuit. The second switching assemblies are configured to be electrically coupled to a plurality of receive electrodes of the capacitive electrode layer. Each of the second switching assemblies includes a switch for being electrically coupled to the corresponding receive electrode, a touch drive circuit installed to the switch, and an antenna circuit installed to the switch. In each of the second switching assemblies, the switch is configured to be in a touch mode by being electrically coupled to the touch drive circuit or in an antenna mode by being electrically coupled to the antenna circuit. When the switch of each of the second switching assemblies is in the touch mode, the switch of each of the first switching assemblies is in the touch mode for enabling the capacitive electrode layer to provide a capacitive touch function. When the switch of the second switching assemblies is in the antenna mode, the switch of each of the first switching assemblies is in the open mode for enabling the receive electrodes of the capacitive electrode layer to provide a charged function.

In summary, the capacitive touch control device, the electricity charging controller, or the electricity charged controller of the present disclosure can be provided for enabling the coupled capacitive electrode layer to have the antenna function, the charging function, or the charged function by the switching assemblies.

In order to further appreciate the characteristics and technical contents of the present disclosure, references are hereunder made to the detailed descriptions and appended

DETAILED DESCRIPTION OF THE EXEMPLARY EMBODIMENTS

Reference is made to FIGS. 1 to 16, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
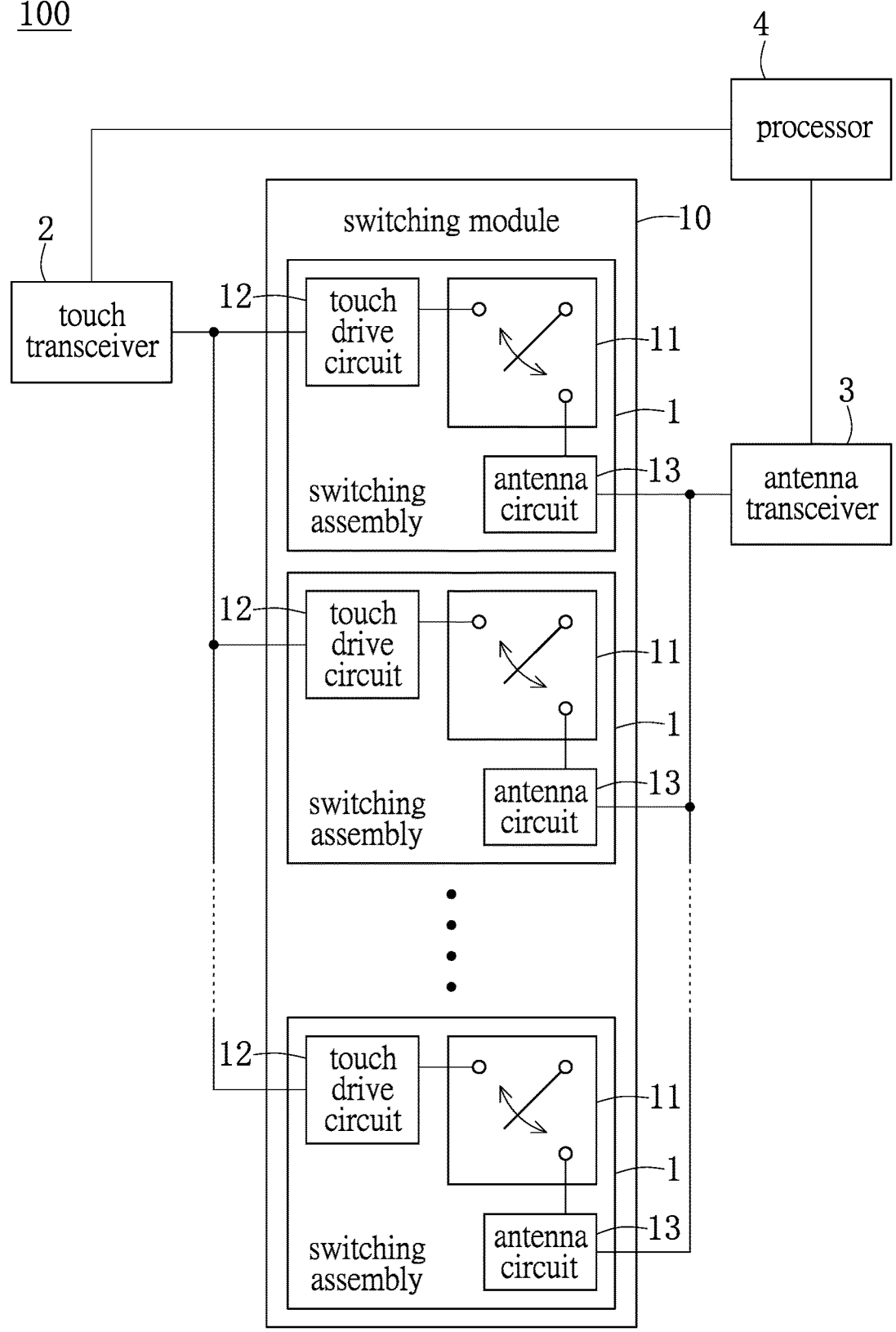
FIG. 1 is a schematic view showing a capacitive touch control device according to a first embodiment of the present disclosure.
Figure 2:
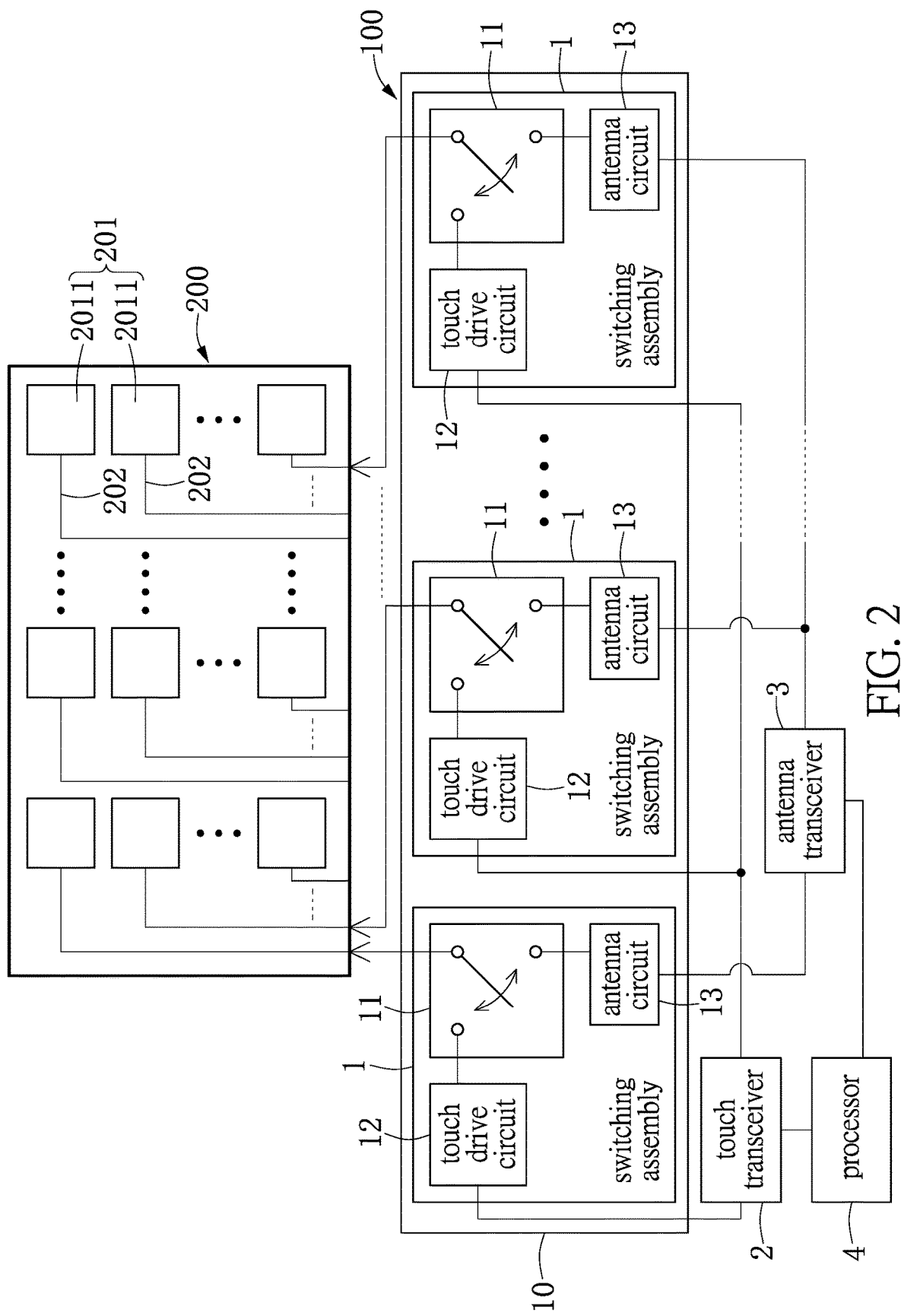
FIG. 2 is a schematic view showing the capacitive touch control device of FIG. 1 applied to a touch control panel.

Referring to FIGS. 1 to 7, which illustrate a first embodiment of the present disclosure. As shown in FIGS. 1 and 2, the present embodiment discloses a capacitive touch control device 100 that can be applied to a touch control panel 200. The touch control panel 200 includes a capacitive electrode layer 201 and a plurality of transmitting wires 202 connected to the capacitive electrode layer 201. The capacitive touch control device 100 of the present embodiment is provided for being electrically coupled to the capacitive electrode layer 201 by the transmitting wires 202, but the present disclosure is not limited thereto. For example, in other embodiments of the present disclosure, the capacitive touch control device 100 can be electrically coupled to the capacitive electrode layer 201 by a transmitting circuit. The transmitting circuit may include a plurality of transmitting wires 202 and a circuit board connected to the transmitting wires 202, or the transmitting circuit can be omitted to simplify the hardware design.

It should be noted that the capacitive touch control device 100 in the present embodiment is applied to the capacitive electrode layer 201 having a self-capacitance structure that includes a plurality of capacitive electrodes 2011 respectively connected to the transmitting wires 202, but the configuration or specific structure of the capacitive electrode layer 201 is not limited thereto. In other words, in other embodiments of the present disclosure, the capacitive touch control device 100 can be applied to conventional capacitive electrode layers formed with various structures, such as mutual-capacitance structure.

The capacitive touch control device 100 includes a switching module 10, a touch transceiver 2 and an antenna transceiver 3 both connected to the switching module 10, and a processor 4 electrically coupled to the touch transceiver 2 and the antenna transceiver 3. The switching module 10 is configured to be electrically coupled to the capacitive electrode layer 201 by the transmitting wires 202, and is also configured to be electrically coupled to at least part of the capacitive electrode layer 201 to the touch transceiver 2 and the antenna transceiver 3 by turns. The processor 4 is configured to control the operation of the switching module 10.

It should be noted that the processor 4 in the present embodiment is configured to control the switching module 10 through the touch transceiver 2 and the antenna transceiver 3, but the present disclosure is not limited thereto. For example, in other embodiments of the present disclosure, the processor 4 can be electrically connected to the switching module 10 directly for controlling the switching module 10, or the processor 4 can be cooperated with other components for controlling the switching module 10.

The switching module 10 in the present embodiment includes a plurality of switching assemblies 1 provided for being respectively connected to the transmitting wires 202. Each of the switching assemblies 1 includes a switch 11, a touch drive circuit 12, and an antenna circuit 13, the latter two of which are installed to the switch 11. The switch 11 of each of the switching assemblies 1 is provided for being connected to the corresponding transmitting wire 202. Moreover, the touch transceiver 2 is electrically coupled to the drive circuits 12 of the switching assemblies 1, and the antenna circuit 13 is electrically coupled to the antenna circuits 13 of the switching assemblies 1.

Figure 3:
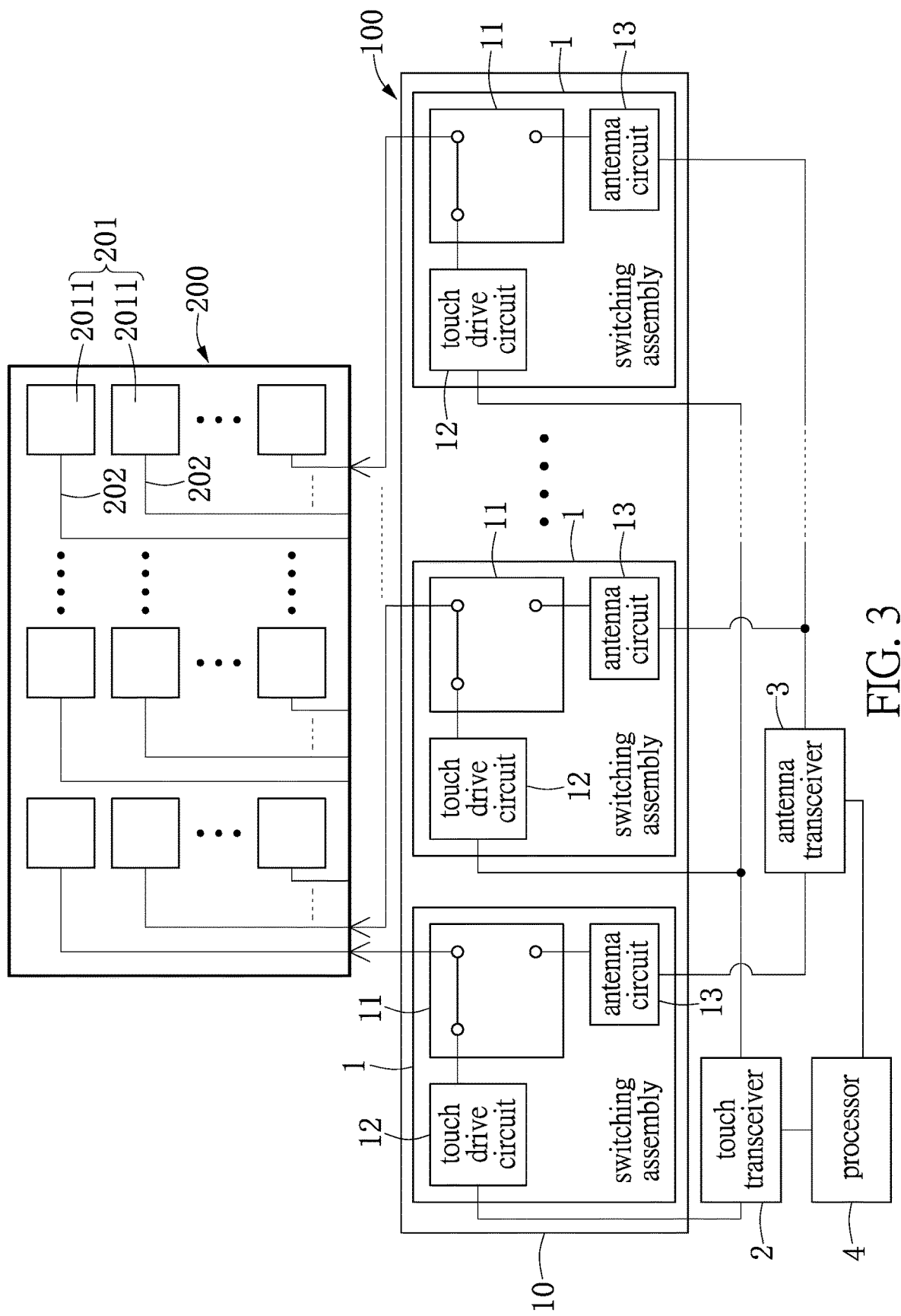
FIG. 3 is a schematic view showing a first operation of the capacitive touch control device of FIG. 2.
Figure 4:
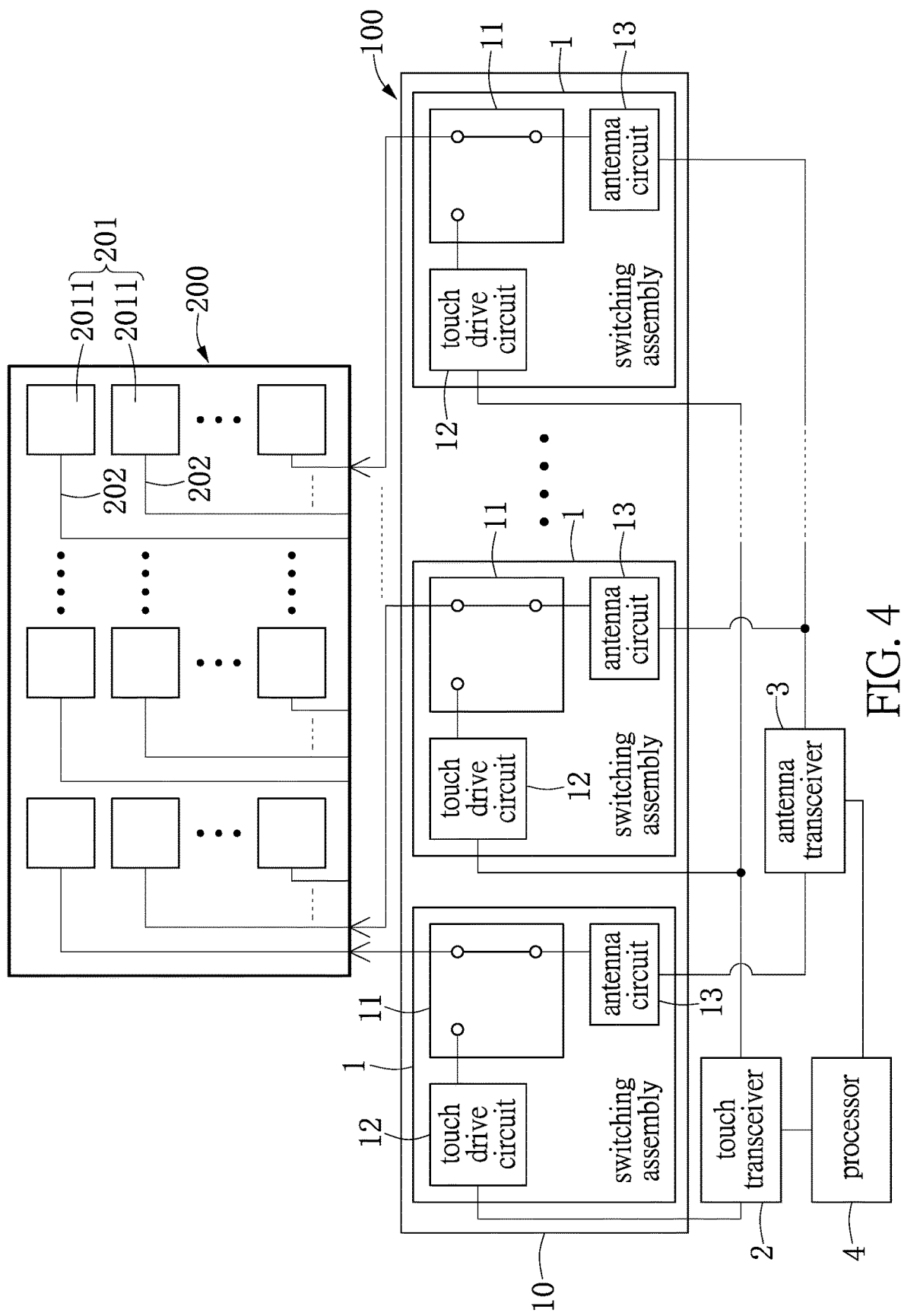
FIG. 4 is a schematic view showing a second operation of the capacitive touch control device of FIG. 2.

The switch 11 is operable to electrically couple to the drive circuit 12 or the antenna circuit 13, or can be operated to not electrically couple to the drive circuit 12 or the antenna circuit 13. Specifically, the switch 11 is configured to be in a touch mode (as shown in FIG. 3) by electrically coupling to the touch drive circuit 12, in an antenna mode (as shown in FIG. 4) by electrically coupling to the antenna circuit 13, or in an open mode (as shown in FIG. 2) by not electrically coupling to the touch drive circuit 12 and the antenna circuit 13. That is to say, the switch 11 of the present embodiment is configured to be in one of the touch mode, the antenna mode, and the open mode, but the present disclosure is not limited thereto. For example, in other embodiments of the present disclosure, the switch 11 can be only in touch mode or the antenna mode.

In other words, each of the switches 11 of the switching module 10 is configured to be in one of the touch mode by electrically coupling to the touch transceiver 2, the antenna mode by electrically coupling to the antenna transceiver 3, and the open mode by not electrically coupling to the touch transceiver 2 and the antenna transceiver 3. Moreover, the processor 4 is electrically coupled to the switching assemblies 1 through the touch transceiver 2 and the antenna transceiver 3. The processor 4 can be used to control the switch 11 of each of the switching assemblies 1 to be in the touch mode and the antenna mode by turns.

Accordingly, as shown in FIG. 3, when the switch 11 of each of the switching assemblies 1 is in the touch mode, the switching assemblies 1 enable the capacitive electrode layer 201 to provide a capacitive touch function through the transmitting wires 202. That is to say, when the switch 11 of each of the switching assemblies 1 is in the touch mode, the existing capacitive touch function of the touch control panel 200 can be operated.

Figure 5:
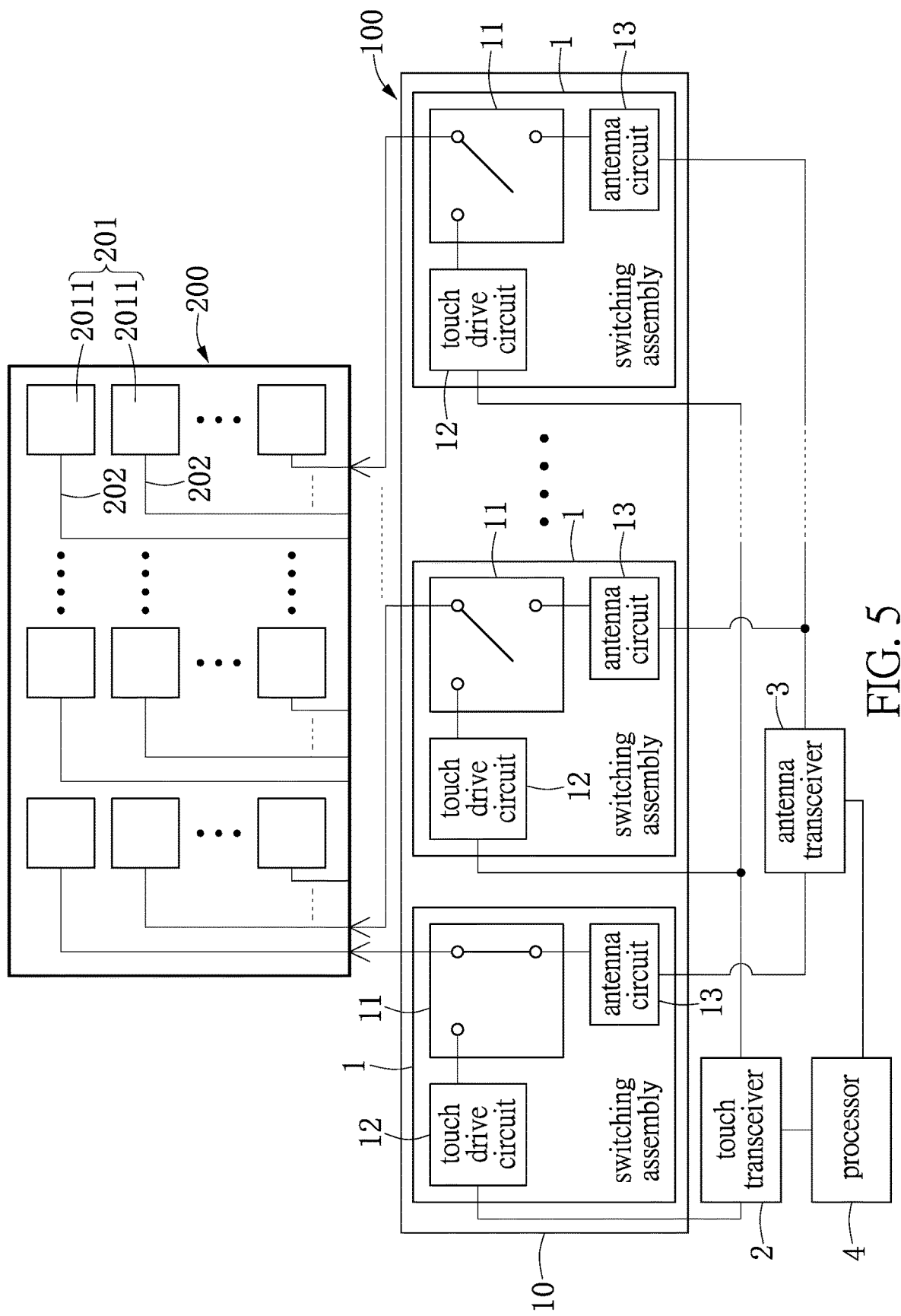
FIG. 5 is a schematic view showing a third operation of the capacitive touch control device of FIG. 2.

Moreover, as shown in FIG. 4, when the switch 11 of each of the switching assemblies 1 is in the antenna mode, each of the switching assemblies 1 enables the capacitive electrode layer 201 to provide an antenna function through the transmitting wires 202, and the transmitting wires 202 (or the capacitive electrodes 2011) can be electrically coupled to each other to form one group. In addition, as shown in FIG. 5, the capacitive touch control device 100 of the present embodiment can adapt the switch 11 of at least one of the switching assemblies 1 to be in the antenna mode, such that the corresponding capacitive electrode 2011 of the capacitive electrode layer 201 can provide an antenna function through the corresponding transmitting wire 202.

Figure 6:
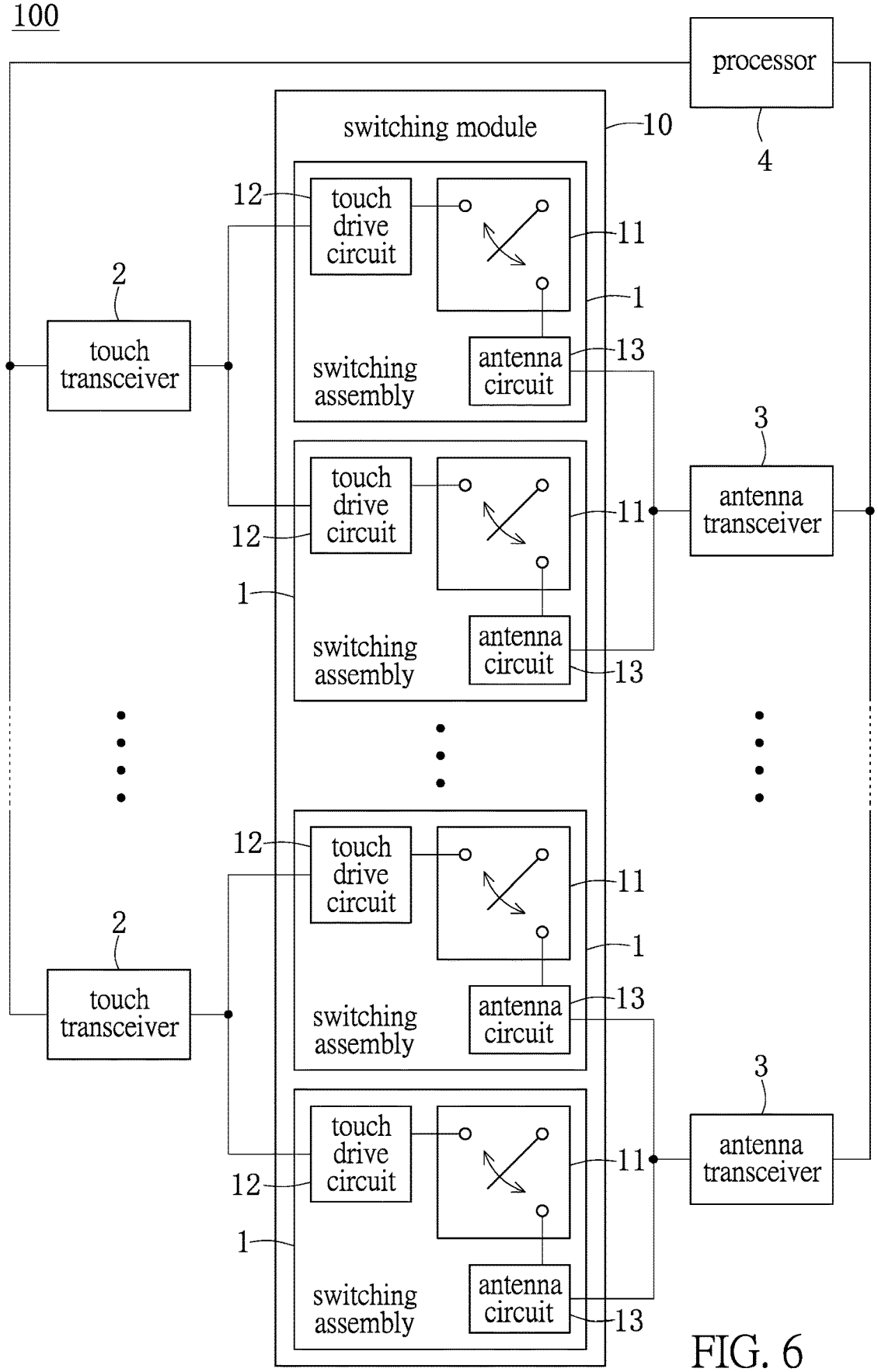
FIG. 6 is a schematic view showing a capacitive touch control device in another configuration according to the first embodiment of the present disclosure.

The number of the touch transceiver 2 (or the antenna transceiver 3) of the capacitive touch control device 100 shown in FIG. 1 is only one, but the present disclosure is not limited thereto. Referring to FIG. 6, the number of the touch transceiver 2 and the number of the antenna transceiver 3 of the capacitive touch control device 100 can each be more than one; each of the touch transceivers 2 is electrically coupled to the touch circuits 12 of two of the switching assemblies 1, and each of the antenna transceivers 3 is electrically coupled to the antenna circuits 13 of two of the switching assemblies 1. Therefore, when the switch 11 of each of the switching assemblies 1 is in the antenna mode, the transmitting wires 202 are electrically coupled to each other to form more than one group.

Figure 7:
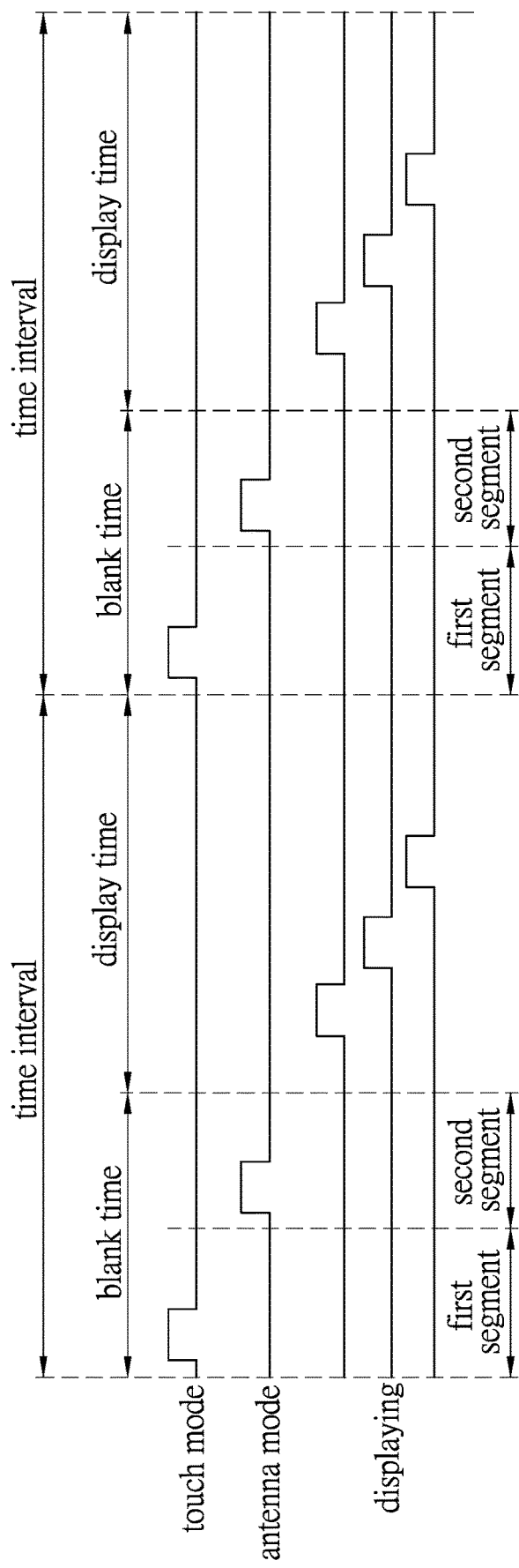
FIG. 7 is a schematic view showing the operation time of the capacitive touch control device according to the first embodiment of the present disclosure.
Figure 8:
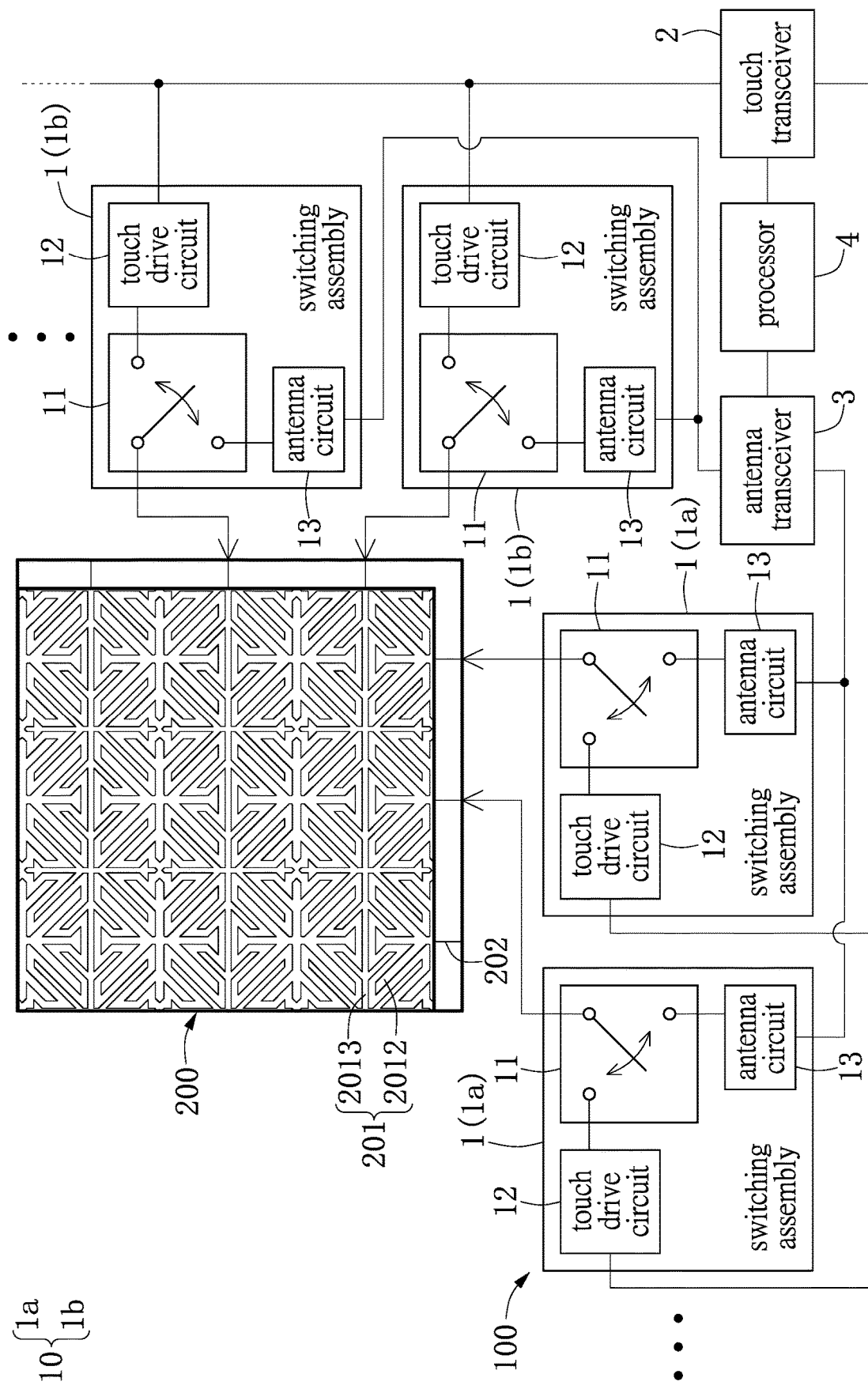
FIG. 8 is a schematic view showing a capacitive touch control device applied to a touch control panel according to a second embodiment of the present disclosure.

The structure and function of the capacitive touch control device 100 in the present embodiment have been disclosed in the above description, and the following description discloses the running time of the capacitive touch control device 100 as being electrically coupled to a display. As shown in FIG. 7, the display is operable in time intervals each having a display time and a blank time. The capacitive touch control device 100 is configured to be operated in the blank time of each of the time intervals.

Specifically, when the capacitive touch control device 100 operates in a first segment of the blank time of each of the time intervals (as shown in FIGS. 3 and 7), the touch transceiver 2 is electrically coupled to the capacitive electrode layer 201 by the switching module 10 (i.e., each of the switches 11 and the corresponding touch circuit 12), and the switch 11 of each of the switching assemblies 1 is in the touch mode.

Moreover, when the capacitive touch control device 100 operates in a second segment of the blank time of each of the time intervals (as shown in FIGS. 4 and 7), the antenna transceiver 3 is electrically coupled to the capacitive electrode layer 201 by the switching module 10 (i.e., each of the switches 11 and the corresponding antenna circuit 13), and the switch 11 of each of the switching assemblies 1 is in the antenna mode.

In addition, when the capacitive touch control device 100 operates in the second segment of each of the time intervals, the switching module 10 and the antenna transceiver 3 are configured for electrically coupling the capacitive electrodes 2011 of the capacitive electrode layer 201 to each other, but the present disclosure is not limited thereto. For example, in other embodiments of the present disclosure, when the capacitive touch control device 100 operates in the second segment of each of the time intervals, the switching module 10 and the antenna transceiver 3 can be operated for electrically coupling at least two capacitive electrodes 2011 to each other.

Accordingly, the operation of the capacitive touch control device 100 in the present embodiment is in the second segment of each of the time intervals, and the displaying of the display and the touch function of the touch control panel 200 do not run in the second segment of each of the time intervals, so that the capacitive touch control device 100 in the present embodiment can be used to add the antenna function for the capacitive electrode layer 201 of the touch control panel 200 without affecting the original operation of the display and the touch control panel 200.

Furthermore, the cooperation between the capacitive touch control device 100 and the capacitive electrode layer 201 can be adjusted to enable the capacitive electrode layer 201 to provide the antenna function, that is to say, the cooperation is not limited to that shown in FIG. 4. For example, as shown in FIG. 5, the capacitive touch control device 100 adapts the switch 11 of at least one of the switching assemblies 1 to be in the antenna mode (i.e., the other switches 11 are in the open mode), so that the at least one of the switching assemblies 1 enables the corresponding capacitive electrode 2011 of the capacitive electrode layer 201 to provide the antenna function through the corresponding transmitting wire 202. In other words, when the capacitive touch control device 100 operates in the second segment of the blank time of each of the time intervals, the antenna transceiver 3 can be electrically coupled to at least part of the capacitive electrode layer 201 (e.g., the corresponding capacitive electrode 2011) by the switching module 10 (e.g., the corresponding switch 11 and the corresponding antenna circuit 13), and the corresponding switch 11 is in the antenna mode.

Moreover, the switching module 10 in the present embodiment includes a plurality of switching assemblies 1, but the present disclosure is not limited thereto. For example, in other embodiments of the present disclosure, the switching module 10 (or the capacitive touch control device 100) can be provided with at least one switching assembly 1.

Second Embodiment

Reference is made to FIGS. 8 to 12, which illustrate a second embodiment of the present disclosure. The second embodiment is similar to the first embodiment, so that identical features or components of the two embodiments will not be disclosed in the following description. The difference between the second embodiment and the first embodiment is disclosed as follows.

The capacitive touch control device 100 in the present embodiment is applied to the capacitive electrode layer 201 having a mutual capacitance structure that includes a plurality of drive electrodes 2012 and a plurality of receive electrodes 2013. The switches 11 of the switching module 10 (or the switching assemblies 1) are configured to be electrically coupled to the drive electrodes 2012 and the receive electrodes 2013 of the capacitive electrode layer 201, respectively.

Figure 9:
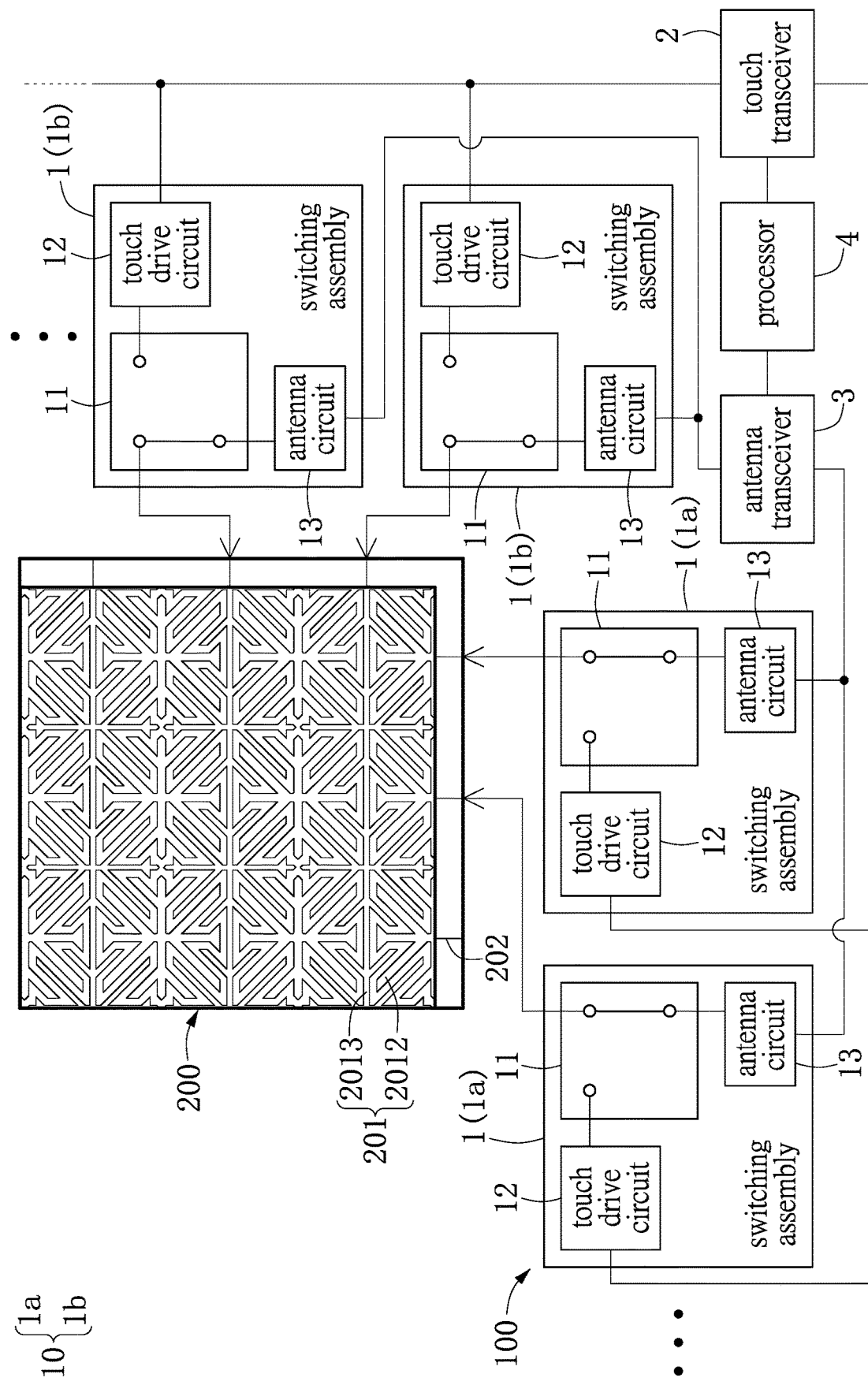
FIG. 9 is a schematic view showing a first operation of the capacitive touch control device of FIG. 8.
Figure 10:
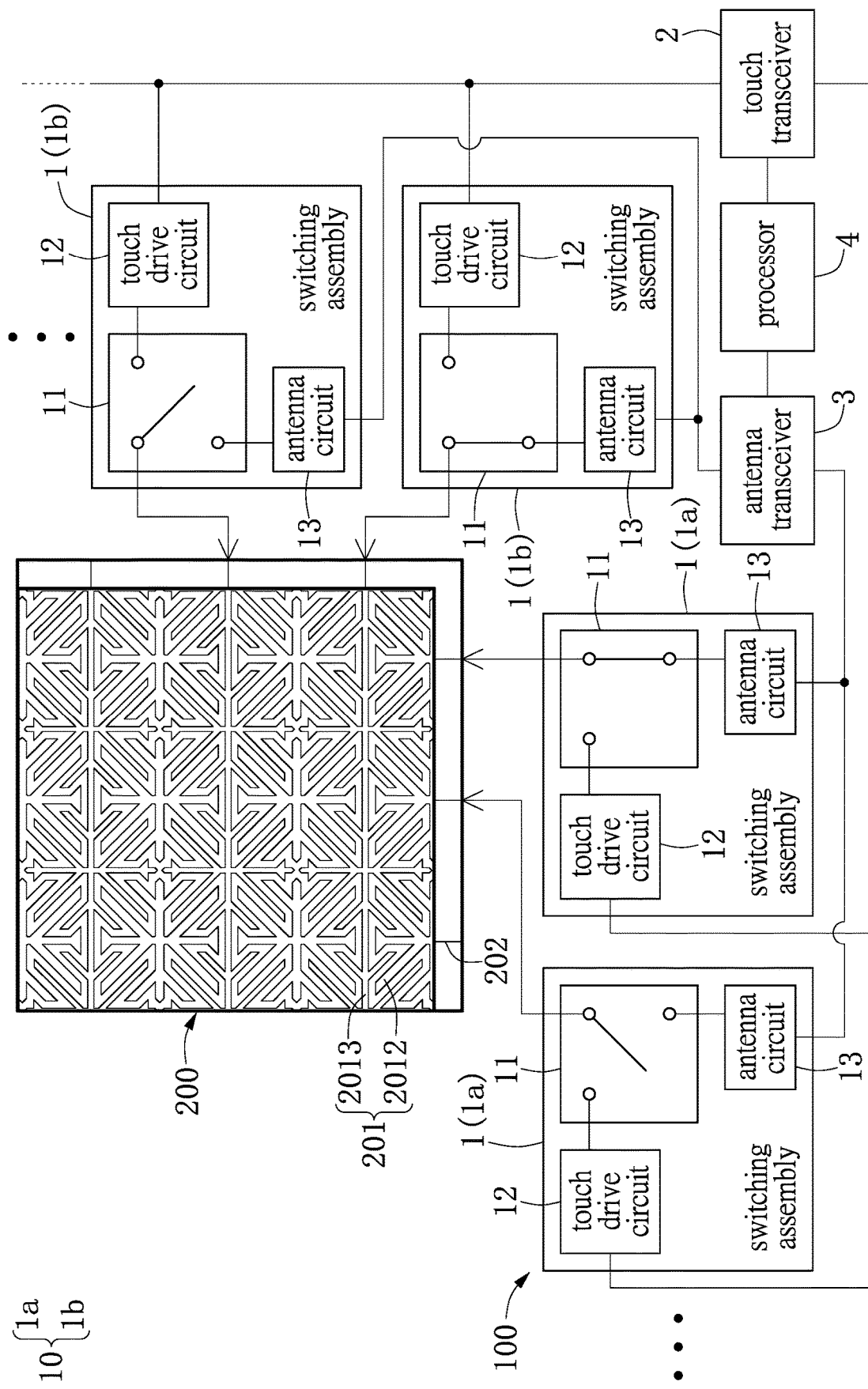
FIG. 10 is a schematic view showing a second operation of the capacitive touch control device of FIG. 8.

Moreover, as shown in FIG. 9, when the switch 11 of each the switching assemblies 1 is in the antenna mode, the antenna transceiver 3 and the switching assemblies 1 are configured for electrically coupling the drive electrodes 2012 to the receive electrodes 2013. In other words, as shown in FIG. 10, when the switches 11 of at least two of the switching assemblies 1 are in the antenna mode, the antenna transceiver 3 and the at least two of the switching assemblies 1 are configured for electrically coupling at least one of the drive electrodes 2012 to at least one of the receive electrodes 2013. In addition, in other embodiments of the present disclosure, when the switch 11 of at least one of the switching assemblies 1 is in the antenna mode, at least two of the transmitting wires 202 corresponding to the switch 11 in the antenna mode are electrically coupled to each other to form one group.

Furthermore, as shown in FIG. 10, when the capacitive touch control device 100 operates in the second segment of the blank time of each of the time intervals, the switching module 10 and the antenna transceiver 3 can be configured for electrically coupling at least one of the drive electrodes 2012 to at least one of the receive electrodes 2013.

Additionally, the switches 11 of the switching module 10 (or the switching assemblies 1) in the present disclosure are not limited to being electrically coupled to the drive electrodes 2012 and the receive electrodes 2013 of the capacitive electrode layer 201, respectively. For example, in other embodiments of the present disclosure, the switches 11 of the switching module 10 can be only electrically coupled to the drive electrodes 2012 (or the receive electrodes 2013) of the capacitive electrode layer 201, and the cooperation between the switching module 10 and the drive electrodes 2012 (or the receive electrodes 2013) would be similar or approximately identical to that of the first embodiment.

It should be noted that the switching assemblies 1 of the present embodiment can be (or include) a plurality of first switching assemblies 1a and a plurality of second switching assemblies 1b for distinguishing the detail difference between the present embodiment and the first embodiment. The first switching assemblies 1a are configured to be electrically coupled to the drive electrodes 2012 of the capacitive electrode layer 201, and the second switching assemblies 1b are configured to be electrically coupled to the receive electrodes 2013 of the capacitive electrode layer 201.

Figure 11:
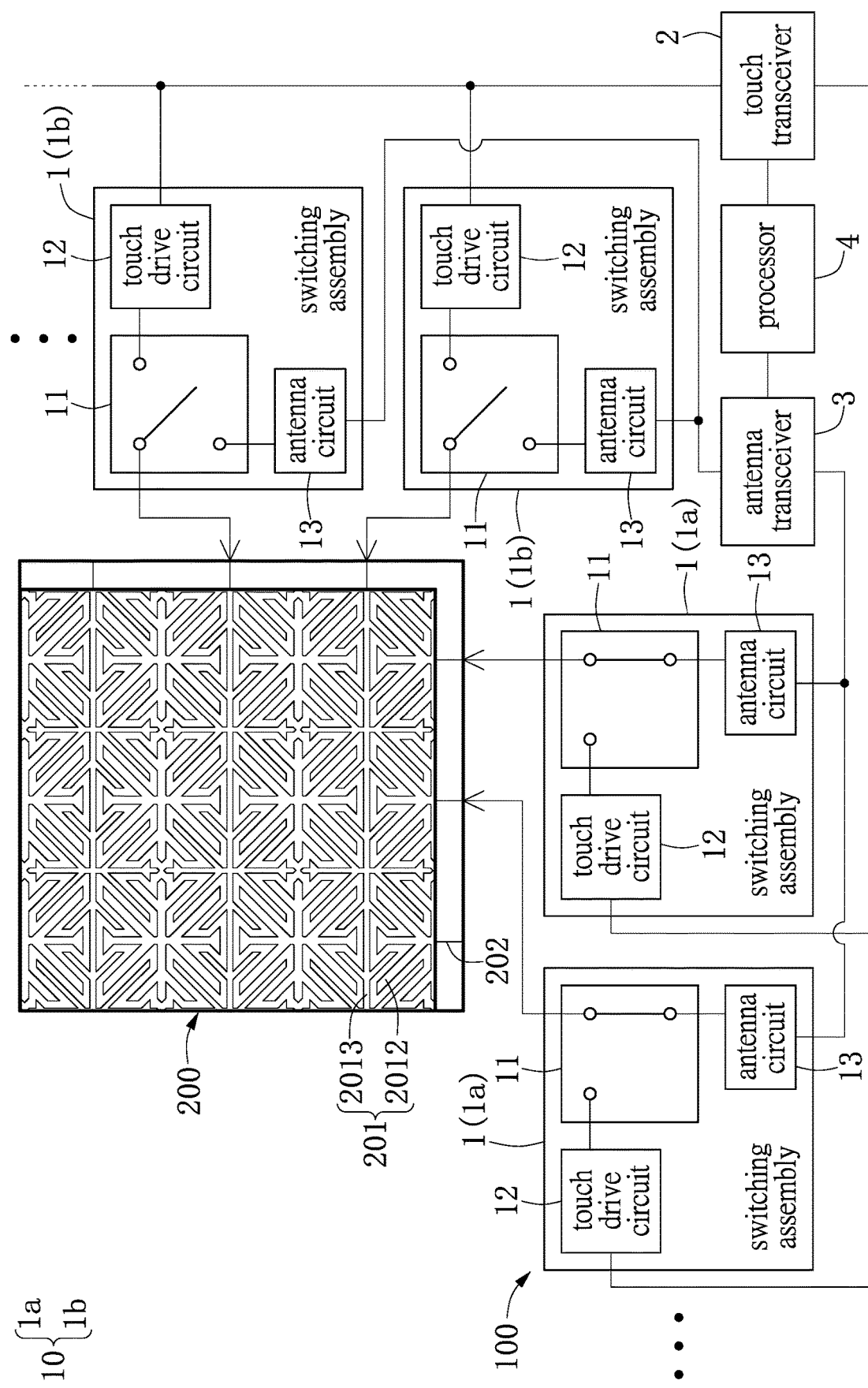
FIG. 11 is a schematic view showing a third operation of the capacitive touch control device of FIG. 8.

Specifically, as shown in FIG. 11, when the capacitive electrode layer 201 provides the antenna function and the drive electrodes 2012 operate to transmit signals, the switch 11 of each of the first switching assemblies 1a is in the antenna mode (i.e., the switches 11 electrically coupled to the drive electrodes 2012 are in the antenna mode), and the switch 11 of each of the second switching assemblies 1b is in the open mode (i.e., the switches 11 electrically coupled to the receive electrodes 2013 are in the open mode).

Figure 12:
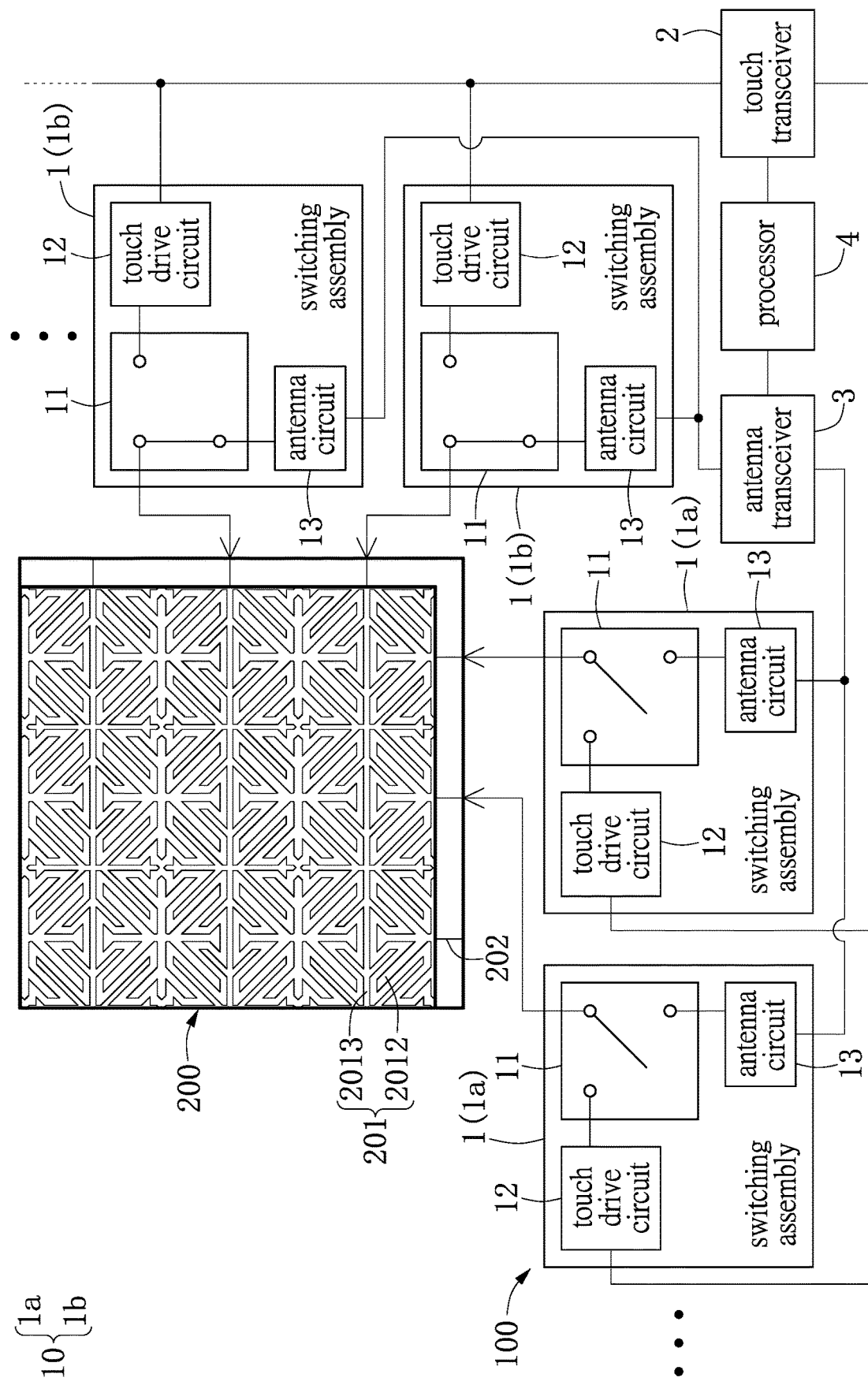
FIG. 12 is a schematic view showing a fourth operation of the capacitive touch control device of FIG. 8.

Moreover, as shown in FIG. 12, when the capacitive electrode layer 201 provides the antenna function and the receive electrodes 2013 operate to receive signals, the switch 11 of each of the first switching assemblies 1a is in the open mode (i.e., the switches 11 electrically coupled to the drive electrodes 2012 are in the open mode), and the switch 11 of each of the second switching assemblies 1b is in the antenna mode (i.e., the switches 11 electrically coupled to the receive electrodes 2013 are in the antenna mode).

Third Embodiment

Figure 13:
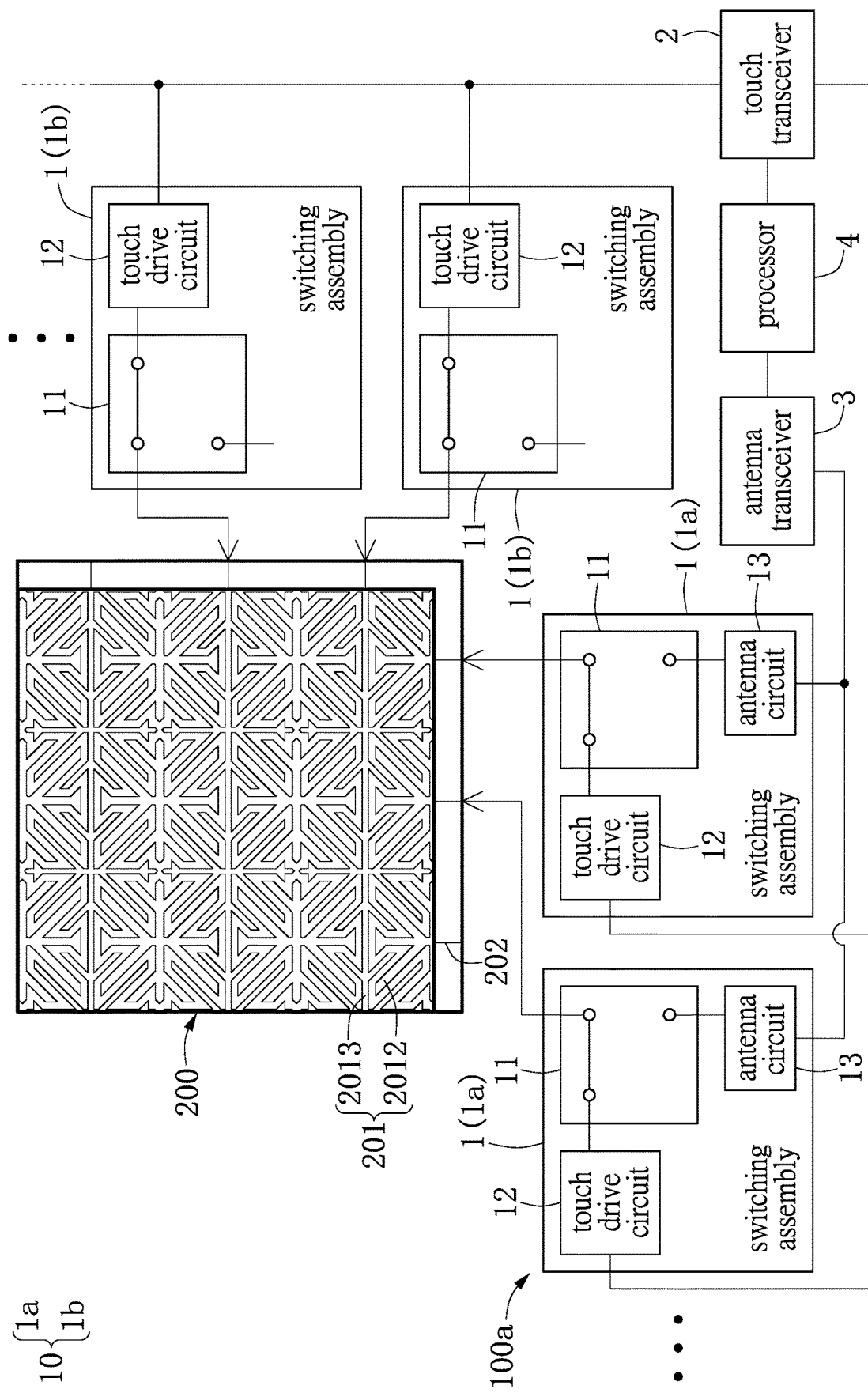
FIG. 13 is a schematic view showing a capacitive touch control device applied to a touch control panel according to a third embodiment of the present disclosure.
Figure 14:
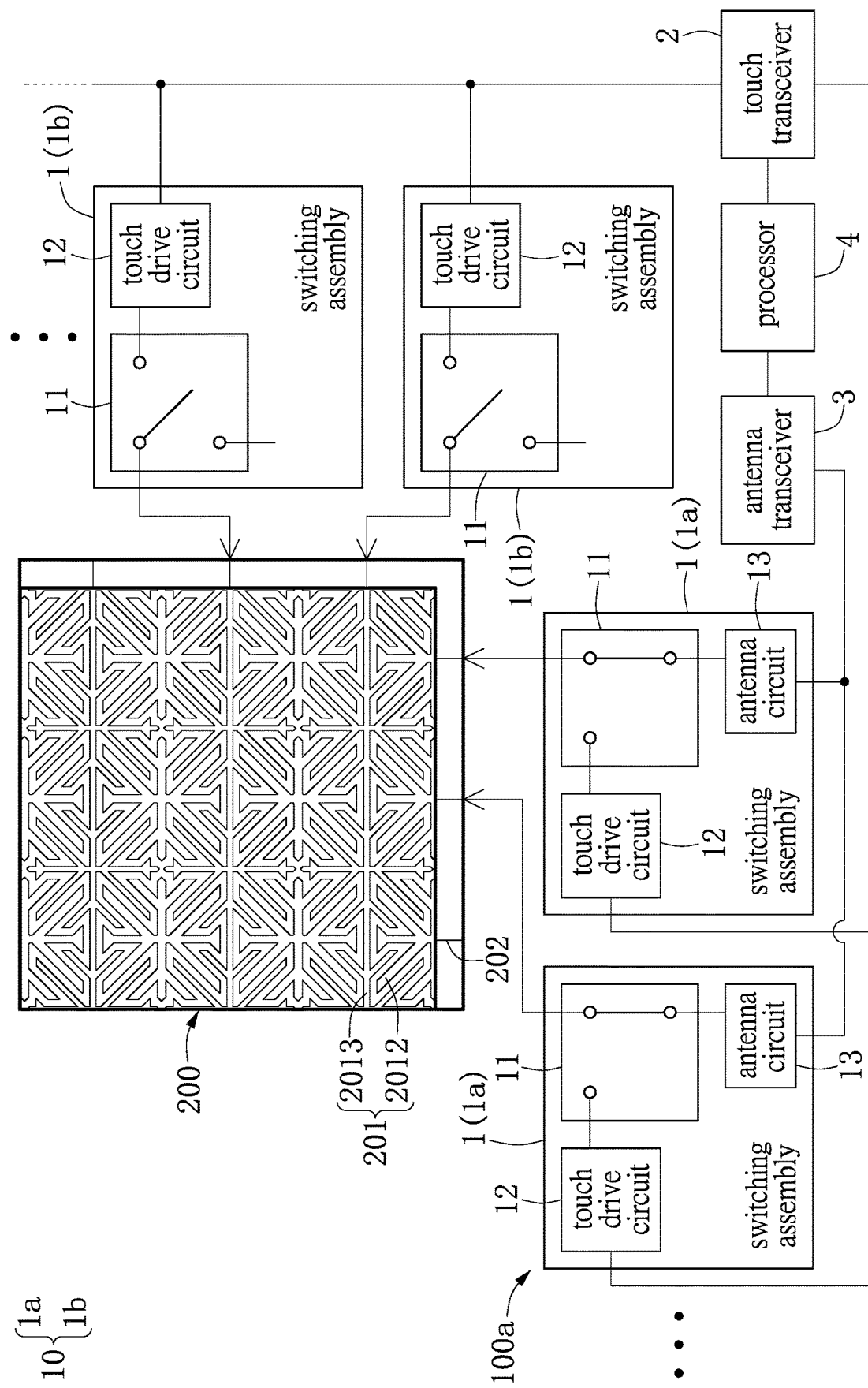
FIG. 14 is a schematic view showing the touch control panel that provides a charging function by the capacitive touch control device.

Reference is made to FIGS. 13 and 14, which illustrate a third embodiment of the present disclosure. The third embodiment is similar to the second embodiment, so that identical features or components of the two embodiments will not be disclosed in the following description. The difference between the third embodiment and the second embodiment is disclosed as follows.

The capacitive touch control device 100 in the present embodiment is regarded as an electricity charging controller 100a. The switching assemblies 1 of the electricity charging controller 100a can be (or include) a plurality of first switching assemblies 1a and a plurality of second switching assemblies 1b. The first switching assemblies 1a are configured to be electrically coupled to the drive electrodes 2012 of the capacitive electrode layer 201, and the second switching assemblies 1b are configured to be electrically coupled to the receive electrodes 2013 of the capacitive electrode layer 201.

Specifically, each of the first switching assemblies 1a includes a switch 11 for being electrically coupled to the corresponding drive electrode 2012, a touch drive circuit 12 installed to the switch 11, and an antenna circuit 13 installed to the switch 11. The switch 11 of each of the first switching assemblies 1a is configured to be in a touch mode by being electrically coupled to the touch drive circuit 12 or in an antenna mode by being electrically coupled to the antenna circuit 13.

Moreover, each of the second switching assemblies 1b includes a switch 11 for being electrically coupled to the corresponding receive electrode 2013 and a touch drive circuit 12 installed to the switch 11. In other words, the second switching assembly 1b of the present embodiment can be provided without any antenna circuit 13, but the present disclosure is not limited thereto. The switch 11 of each of the second switching assemblies 1b is configured to be in a touch mode by being electrically coupled to the touch drive circuit 12 or in an open mode by not being electrically coupled to the touch drive circuit 12.

Accordingly, as shown in FIG. 13, when the switch 11 of each of the first switching assemblies 1a is in the touch mode, the switch 11 of each of the second switching assemblies 1b is in the touch mode for enabling the capacitive electrode layer 201 to provide a capacitive touch function by the electricity charging controller 100a. Moreover, as shown in FIG. 14, when the switch 11 of the first switching assemblies 1a is in the antenna mode, the switch 11 of each of the second switching assemblies 1b is in the open mode for enabling the drive electrodes 2012 of the capacitive electrode layer 201 to provide a charging function by the electricity charging controller 100a.

Fourth Embodiment

Figure 15:
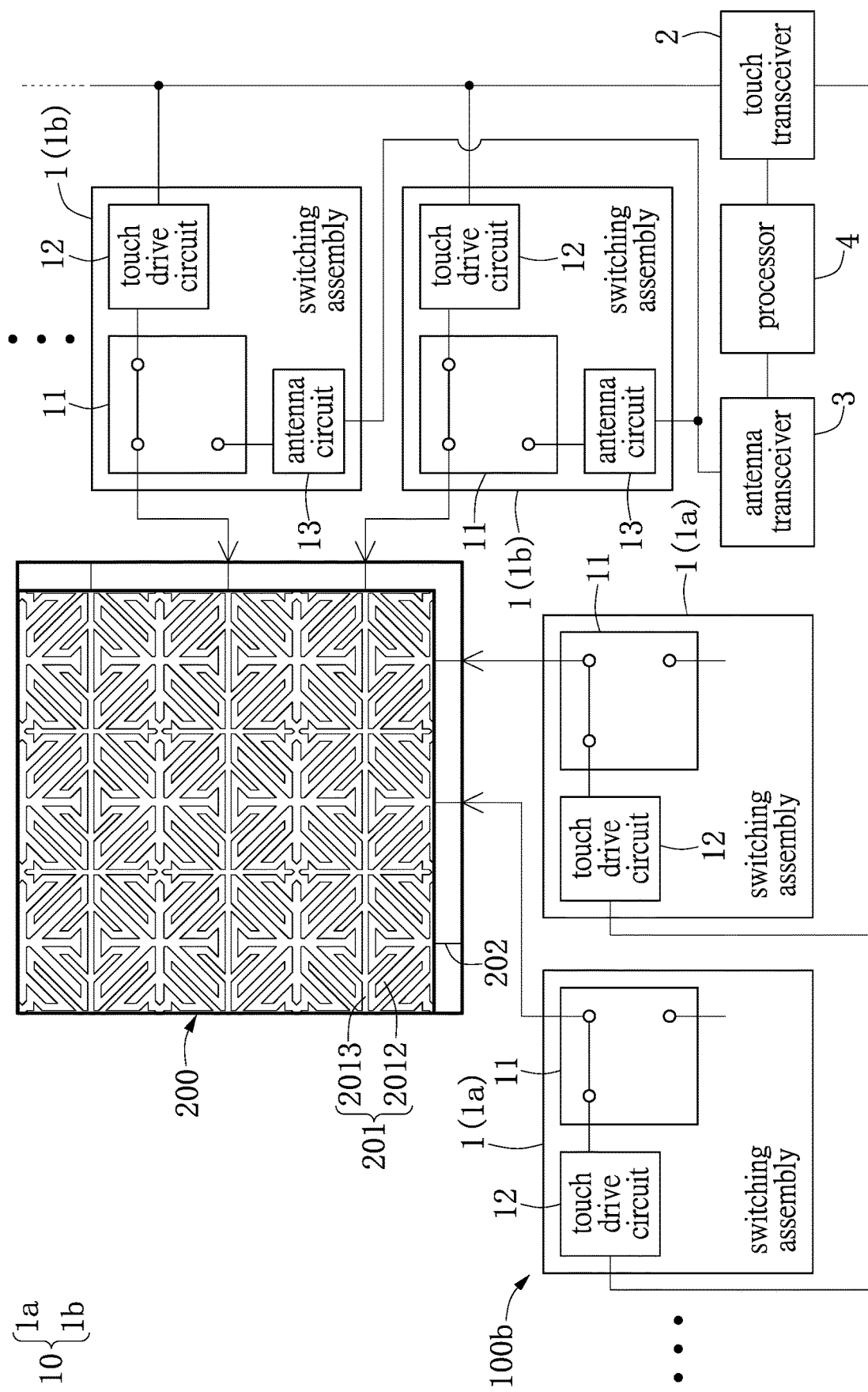
FIG. 15 is a schematic view showing a capacitive touch control device applied to a touch control panel according to a fourth embodiment of the present disclosure.
Figure 16:
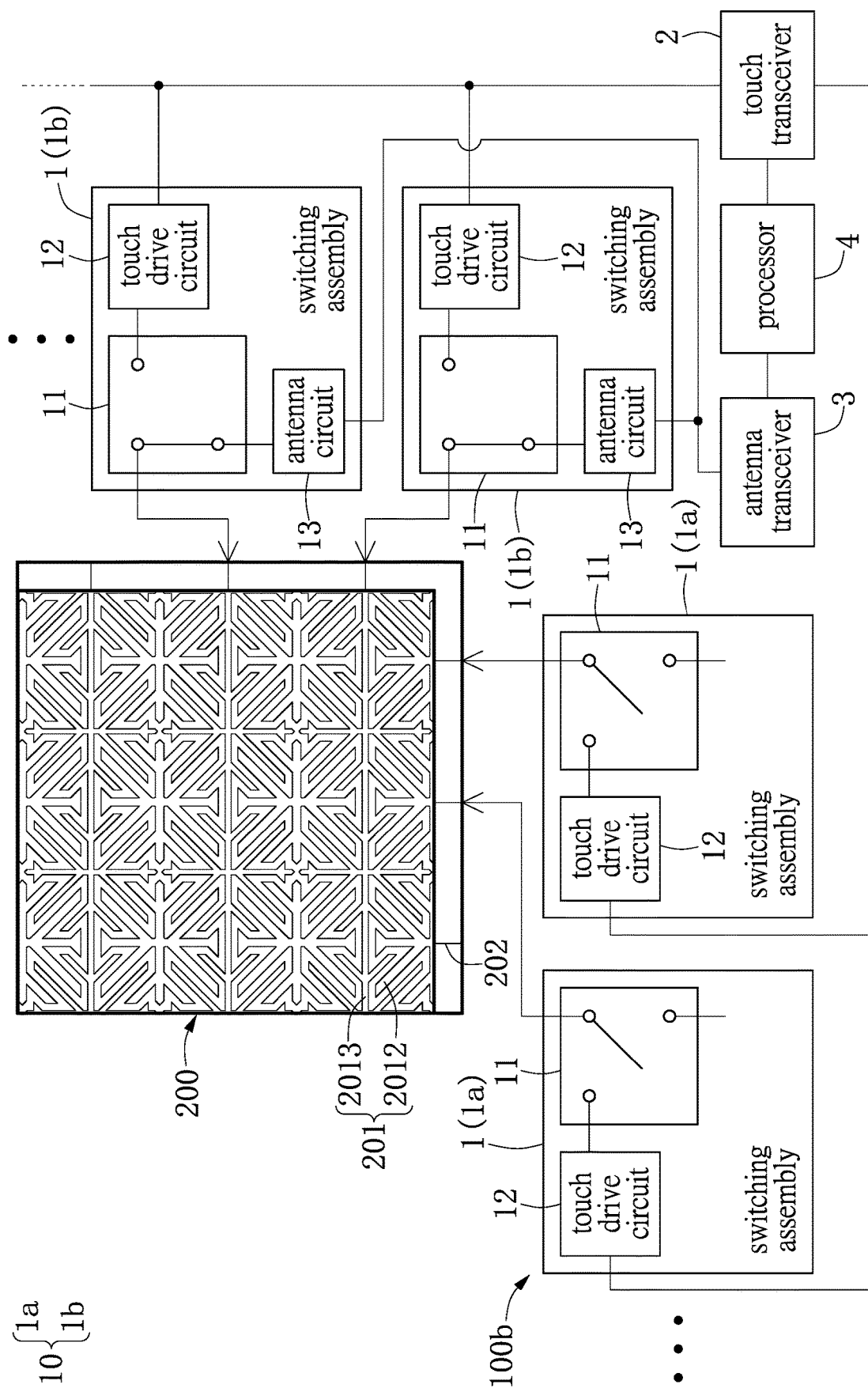
FIG. 16 is a schematic view showing the touch control panel that provides a charged function by the capacitive touch control device.

Reference is made to FIGS. 15 and 16, which illustrate a fourth embodiment of the present disclosure. The fourth embodiment is similar to the second embodiment, so that identical features or components of the two embodiments will not be disclosed in the following description. The difference between the fourth embodiment and the second embodiment is disclosed as follows.

The capacitive touch control device 100 in the present embodiment is regarded as an electricity charged controller 100b. The switching assemblies 1 of the electricity charged controller 100b can be (or include) a plurality of first switching assemblies 1a and a plurality of second switching assemblies 1b. The first switching assemblies 1a are configured to be electrically coupled to the drive electrodes 2012 of the capacitive electrode layer 201, and the second switching assemblies 1b are configured to be electrically coupled to the receive electrodes 2013 of the capacitive electrode layer 201.

Specifically, each of the first switching assemblies 1a includes a switch 11 for being electrically coupled to the corresponding drive electrode 2012 and a touch drive circuit 12 installed to the switch 11. In other words, the first switching assembly 1a of the present embodiment can be provided without any antenna circuit 13, but the present disclosure is not limited thereto. The switch 11 of each of the first switching assemblies 1a is configured to be in a touch mode by being electrically coupled to the touch drive circuit 12 or in an open mode by not electrically coupling to the touch drive circuit 12.

Moreover, each of the second switching assemblies 1b includes a switch 11 for being electrically coupled to the corresponding receive electrode 2013, a touch drive circuit 12 installed to the switch 11, and an antenna circuit 13 installed to the switch 11. The switch 11 of each of the second switching assemblies 1b is configured to be in a touch mode by being electrically coupled to the touch drive circuit 12 or in an antenna mode by being electrically coupled to the antenna circuit 13.

Accordingly, as shown in FIG. 15, when the switch 11 of each of the second switching assemblies 1b is in the touch mode, the switch 11 of each of the first switching assemblies 1a is in the touch mode for enabling the capacitive electrode layer 201 to provide a capacitive touch function by the electricity charged controller 100b. Moreover, as shown in FIG. 16, when the switch 11 of the second switching assemblies 1b is in the antenna mode, the switch 11 of each of the first switching assemblies 1a is in the open mode for enabling the receive electrodes 2013 of the capacitive electrode layer 201 to provide a charged function by the electricity charged controller 100b.

Technical Effects of the Present Embodiments

In summary, the capacitive touch control device, the electricity charging controller, or the electricity charged controller of the present embodiments can be provided for enabling the coupled capacitive electrode layer to have the antenna function, the charging function, or the charged function by the switching assemblies.

Moreover, the operation of the capacitive touch control device, the electricity charging controller, or the electricity charged controller in the present embodiments is in the second segment of each of the time intervals, and the displaying of the display and the touch function of the touch control panel do not run in the second segment of each of the time intervals, so that the capacitive touch control device, the electricity charging controller, or the electricity charged controller in the present embodiments can be used to add the antenna function, the charging function, or the charged function for the capacitive electrode layer of the touch control panel without affecting the original operation of the display and the touch control panel.

The descriptions illustrated supra set forth simply the exemplary embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A capacitive touch control device for being electrically coupled to a capacitive electrode layer through a plurality of transmitting wires, comprising: a plurality of switching assemblies for being respectively connected to the transmitting wires, each of the switching assemblies including:
   a switch for being connected to the corresponding transmitting wire; and
   a touch drive circuit and an antenna circuit both installed to the switch, wherein the switch is configured to be in a touch mode by electrically coupling to the touch drive circuit or in an antenna mode by electrically coupling to the antenna circuit,
   wherein when the switch of each of the switching assemblies is in the touch mode, the switching assemblies enable the capacitive electrode layer to provide a capacitive touch function through the transmitting wires; and
   wherein when the switch of at least one of the switching assemblies is in the antenna mode, the at least one of the switching assemblies enables the capacitive electrode layer to provide an antenna function through the corresponding transmitting wire.

2. The capacitive touch control device as claimed in claim 1, wherein when the switch of at least one of the switching assemblies is in the antenna mode, at least two of the transmitting wires corresponding to the switch in the antenna mode are electrically coupled to each other to form one group.

3. The capacitive touch control device as claimed in claim 1, wherein when the switch of each of the switching assemblies is in the antenna mode, the transmitting wires are electrically coupled to each other to form more than one group.

4. The capacitive touch control device as claimed in claim 1, further comprising a processor electrically coupled to the switching assemblies, wherein the processor is configured to control the switching assemblies to be in the touch mode and the antenna mode by turns.

5. The capacitive touch control device as claimed in claim 1, for being electrically coupled to a display operable in time intervals each having a display time and a blank time, wherein the capacitive touch control device is configured to be operated in the blank time of each of the time intervals.

6. The capacitive touch control device as claimed in claim 5, wherein when the capacitive touch control device operates in a first segment of the blank time of each of the time intervals, the switch of each of the switching assemblies is in the touch mode; when the capacitive touch control device operates in a second segment of the blank time of each of the time intervals, the switch of at least one of the switching assemblies is in the antenna mode.

7. The capacitive touch control device as claimed in claim 1, further comprising:
   a touch transceiver electrically coupled to the touch drive circuits of the switching assemblies; and
   an antenna transceiver electrically coupled to the antenna circuits of the switching assemblies.

8. The capacitive touch control device as claimed in claim 7, wherein when the switches of at least two of the switching assemblies are in the antenna mode, the antenna transceiver and the at least two of the switching assemblies are configured for electrically coupling at least one drive electrode of the capacitive electrode layer to at least one receive electrode of the capacitive electrode layer.

9. The capacitive touch control device as claimed in claim 7, wherein when the switch of each of the switching assemblies is in the antenna mode, the antenna transceiver and the switching assemblies are configured for electrically coupling a plurality of drive electrodes of the capacitive electrode layer to a plurality of receive electrodes of the capacitive electrode layer.

10. The capacitive touch control device as claimed in claim 1, wherein the switch of each of the switching assemblies is configured to be in one of the touch mode, the antenna mode, and an open mode, and wherein when the switch of each of the switching assemblies is in the open mode, the switch does not electrically couple to the touch drive circuit and the antenna circuit.

11. The capacitive touch control device as claimed in claim 10, wherein the switching assemblies include:
  a plurality of first switching assemblies for being electrically coupled to a plurality of drive electrodes of the capacitive electrode layer; and
  a plurality of second switching assemblies for being electrically coupled to a plurality of receive electrodes of the capacitive electrode layer,
  wherein when the capacitive electrode layer provides the antenna function and the drive electrodes operate to transmit signal, the switch of each of the first switching assemblies is in the antenna mode, and the switch of each of the second switching assemblies is in the open mode, and
  wherein when the capacitive electrode layer provides the antenna function and the receive electrodes operate to receive signal, the switch of each of the first switching assemblies is in the open mode, and the switch of each of the second switching assemblies is in the antenna mode.

12. A capacitive touch control device for being connected to a transmitting circuit being electrically coupled to a capacitive electrode layer, comprising:
  a switching module for being electrically coupled to the capacitive electrode layer through the transmitting circuit; and
  a touch transceiver and an antenna transceiver both connected to the switching module, wherein the switching module is configured for electrically coupling at least part of the capacitive electrode layer to the touch transceiver and the antenna transceiver by turns.

13. The capacitive touch control device as claimed in claim 12, for being electrically coupled to a display operable in time intervals each having a display time and a blank time, wherein the capacitive touch control device is configured to be operated in the blank time of each of the time intervals.

14. The capacitive touch control device as claimed in claim 13, wherein when the capacitive touch control device operates in a first segment of the blank time of each of the time intervals, the touch transceiver is electrically coupled to the capacitive electrode layer by the switching module; when the capacitive touch control device operates in a second segment of the blank time of each of the time intervals, the antenna transceiver is electrically coupled to at least part of the capacitive electrode layer by the switching module.

15. The capacitive touch control device as claimed in claim 14, wherein when the capacitive touch control device operates in the second segment of the blank time of each of the time intervals, the switching module and the antenna transceiver are configured for electrically coupling at least two capacitive electrodes of the capacitive electrode layer to each other.

16. The capacitive touch control device as claimed in claim 14, wherein when the capacitive touch control device operates in the second segment of the blank time of each of the time intervals, the switching module and the antenna transceiver are configured for electrically coupling at least one drive electrode of the capacitive electrode layer to at least one receive electrode of the capacitive electrode layer.

17. The capacitive touch control device as claimed in claim 12, wherein the switching module includes a plurality of switches each configured to be in one of a touch mode by electrically coupling to the touch transceiver, an antenna mode by electrically coupling to the antenna transceiver, and an open mode by not electrically coupling to the touch transceiver and the antenna transceiver.

18. The capacitive touch control device as claimed in claim 17, wherein the switches of the switching module are provided for being electrically coupled to a plurality of drive electrodes and a plurality of receive electrodes of the capacitive electrode layer, respectively, wherein when the capacitive electrode layer provides an antenna function and the drive electrodes operate to transmit signal, a part of the switches electrically coupled to the drive electrodes are in the antenna mode, and the other switches electrically coupled to the receive electrodes are in the open mode, and wherein when the capacitive electrode layer provides an antenna function and the receive electrodes operate to receive signal, a part of the switches electrically coupled to the drive electrodes are in the open mode, and the other switches electrically coupled to the receive electrodes are in the antenna mode.

19. An electricity charging controller, comprising:
  a plurality of first switching assemblies for being electrically coupled to a plurality of drive electrodes of a capacitive electrode layer, wherein each of the first switching assemblies includes a switch for being electrically coupled to the corresponding drive electrode, a touch drive circuit installed to the switch, and an antenna circuit installed to the switch, wherein in each of the first switching assemblies, the switch is configured to be in a touch mode by being electrically coupled to the touch drive circuit or in an antenna mode by being electrically coupled to the antenna circuit; and
  a plurality of second switching assemblies for being electrically coupled to a plurality of receive electrodes of the capacitive electrode layer, wherein each of the second switching assemblies includes a switch for being electrically coupled to the corresponding receive electrode and a touch drive circuit installed to the switch, wherein in each of the second switching assemblies, the switch is configured to be in a touch mode by being electrically coupled to the touch drive circuit or in an open mode by not being electrically coupled to the touch drive circuit,
  wherein when the switch of each of the first switching assemblies is in the touch mode, the switch of each of the second switching assemblies is in the touch mode for enabling the capacitive electrode layer to provide a capacitive touch function; and
  wherein when the switch of the first switching assemblies is in the antenna mode, the switch of each of the second switching assemblies is in the open mode for enabling the drive electrodes of the capacitive electrode layer to provide a charging function.

20. An electricity charged controller, comprising:

a plurality of first switching assemblies for being electrically coupled to a plurality of drive electrodes of a capacitive electrode layer, wherein each of the first switching assemblies includes a switch for being electrically coupled to the corresponding drive electrode and a touch drive circuit installed to the switch, wherein in each of the first switching assemblies, the switch is configured to be in a touch mode by being electrically coupled to the touch drive circuit or in an open mode by not being electrically coupled to the touch drive circuit; and a plurality of second switching assemblies for being electrically coupled to a plurality of receive electrodes of the capacitive electrode layer, wherein each of the second switching assemblies includes a switch for being electrically coupled to the corresponding receive electrode, a touch drive circuit installed to the switch, and an antenna circuit installed to the switch, wherein in each of the second switching assemblies, the switch is configured to be in a touch mode by being electrically coupled to the touch drive circuit or in an antenna mode by being electrically coupled to the antenna circuit, wherein when the switch of each of the second switching assemblies is in the touch mode, the switch of each of the first switching assemblies is in the touch mode for enabling the capacitive electrode layer to provide a capacitive touch function; and wherein when the switch of the second switching assemblies is in the antenna mode, the switch of each of the first switching assemblies is in the open mode for enabling the receive electrodes of the capacitive electrode layer to provide a charged function.

* * * * *